United States Patent [19]

Kumaoka et al.

[11] 4,232,393
[45] Nov. 4, 1980

[54] MUTING ARRANGEMENT OF A RADIO RECEIVER WITH A PHASE-LOCKED LOOP FREQUENCY SYNTHESIZER

[75] Inventors: Michiaki Kumaoka; Sinzi Aosima, both of Shizuoka, Japan

[73] Assignee: Nippon Gakki Seizo Kabushiki Kaisha, Shizuoka, Japan

[21] Appl. No.: 972,069

[22] Filed: Dec. 21, 1978

[30] Foreign Application Priority Data

Feb. 2, 1978 [JP] Japan .................. 53/11681[U]

[51] Int. Cl.³ ................. H04B 1/10; H04B 1/16
[52] U.S. Cl. .................... 455/154; 455/183; 455/194; 455/212; 331/DIG. 2; 179/1 G
[58] Field of Search ............... 325/344, 346, 348, 419, 325/420, 421, 464, 478, 456, 17, 455; 331/1 A, 18, DIG. 2, 25; 179/1 GD, 1 G

[56] References Cited

U.S. PATENT DOCUMENTS

| 3,766,482 | 10/1973 | Brown, Jr. et al. ............. 325/419 |
|---|---|---|
| 3,919,482 | 11/1975 | Hamada ....................... 325/348 |
| 3,932,821 | 1/1976 | McClaskey ................ 331/DIG. 2 |
| 3,939,425 | 2/1976 | Toyoshima ................... 325/348 |
| 3,949,305 | 4/1976 | McClaskey et al. ............. 325/421 |
| 4,035,727 | 7/1977 | Ishii .......................... 325/17 |
| 4,087,756 | 5/1978 | Rogers, Jr. ................... 325/348 |
| 4,109,283 | 8/1978 | Rast .......................... 325/419 |

Primary Examiner—Jin F. Ng
Attorney, Agent, or Firm—Frishauf, Holtz, Goodman & Woodward

[57] ABSTRACT

In a muting arrangement of a radio receiver using a phase-locked loop frequency synthesizer as a local oscillator, a detector detects an in-lock or out-of-lock state of the phase-locked loop through an output state of a phase comparator included in a feedback loop of the phase-locked loop frequency synthesizer, and a mute gate provided in a signal transmission path of the receiver is operated to mute an audio output when the phase-locked loop is out of lock. An indicator may be provided for visually indicating that the phase-locked loop is in lock.

5 Claims, 2 Drawing Figures

MUTING ARRANGEMENT OF A RADIO RECEIVER WITH A PHASE-LOCKED LOOP FREQUENCY SYNTHESIZER

BACKGROUND OF THE INVENTION

This invention relates to a radio receiver including a phase-locked loop frequency synthesizer as a local oscillator, and more particularly to a muting arrangement of such radio receiver.

As is generally known, a phase-locked loop frequency synthesizer is comprised of a voltage-controlled oscillator (VCO), a divide-by-N counter to divide the output frequency of VCO by a factor of N, a phase comparator for comparing in phase a reference frequency signal with the output signal of the divide-by-N counter, and a loop filter coupling VCO with a control voltage signal with a magnitude corresponding to the phase difference between the input signals of the phase comparator. In the stable state of the phase-locked loop, that is, where the two input signals of the phase comparator coincide in phase with each other, the output frequency of VCO is equal to a product of the reference frequency and the dividing factor of the phase-locked loop. Therefore, using a stable reference frequency source, it is possible to generate an exact local oscillation frequency which permits, in turn, exact tuning of the receiver. By changing the dividing factor N of the phase-locked loop in integral steps, VCO has its output frequency varied in steps at predetermined frequency spaces (the reference frequency), thereby scanning channels within a desired received frequency range.

In such phase-locked loop frequency synthesizer, when the dividing factor N is changed it takes some period of time for the synthesizer to lock to an output frequency corresponding to a newly designated dividing factor N, and noises and/or audio signals with distortion and insufficient separation may be produced during such period of time. In order to prevent production of interstation noises, many of conventional radio receivers are provided with a mute circuit for interrupting a signal transmission path when no incoming input signal is received. Such mute circuit is so arranged as to interrupt the signal transmission path after detecting a state in which the signal input level is lowered. Accordingly, if such mute circuit is applied to a radio receiver with a phase-locked loop frequency synthesizer, there will be sounded noises and/or audio signals of the deteriorated quality from a time when the phase-locked loop is shifted from the stable state to the unstable state until a time when the signal level is actually lowered to interrupt the signal transmission path.

SUMMARY OF THE INVENTION

The object of this invention is to provide a muting arrangement of a radio receiver with a phase-locked loop frequency synthesizer in which a signal transmission path is interrupted immediately when a phase-locked loop is shifted to an unstable state.

According to this invention, there is provided, at the output side of a phase comparator included in a feedback loop of a phase-locked loop frequency synthesizer, a non-lock detection circuit which detects a state in which the output signal of a frequency divider and a reference frequency signal from a reference oscillator are not coincident in phase, that is, where a phase-locked loop is not in lock, causing a mute circuit provided in a signal transmission path to mute a signal when the phase-locked loop is not in lock. Therefore no sound is produced unless the receiver is exactly tuned to a broadcast signal.

An indicator means may be connected to the mute control circuit for visually indicating that the phase-locked loop is in the stable state.

DETAILED DESCRIPTION OF THE PREFERRED EMBODIMENT

Figure 1:
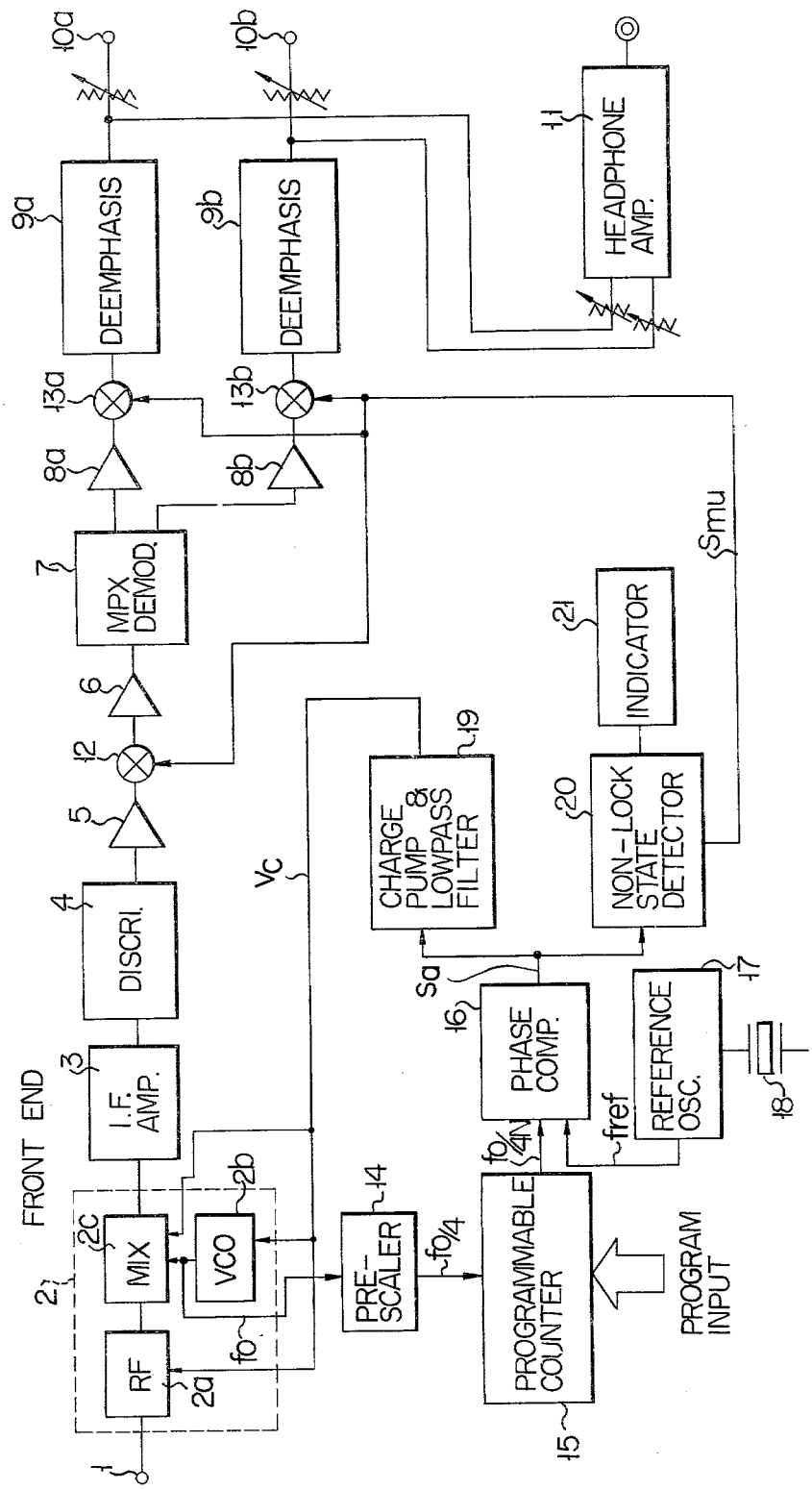
FIG. 1 is a schematic block diagram showing one embodiment of a radio receiver according to this invention.

In FIG. 1 showing an automatic frequency scanning FM stereo tuner or receiver, an incoming FM stereo broadcast signal is applied from an antenna input terminal 1 to a front end 2 comprised of a radio frequency amplifier 2a, a voltage-controlled oscillator (VCO) 2b are mixed to produce an intermediate-frequency FM signal centered at 10.7 MHz. The intermediate-frequency FM signal is amplified by an intermediate-frequency amplifier 3 and then applied to a frequency discriminator 4 to recover a stereo composite signal from the FM signal.

The composite signal is applied through amplifiers 5 and 6 to a multiplex demodulator or stereo detector 7 where left and right stereophonic audio signals are demodulated. The left audio signal is applied through an amplifier 8a and a buffer and deemphasis circuit 9a to a left output terminal 10a, and the right audio signal is applied through an amplifier 8b and a buffer and deemphasis circuit 9b to a right output terminal 10b. The output signals of the deemphasis circuits 9a and 9b are also applied to a headphone amplifier 11. In the arrangement of FIG. 1, mute circuits 12, 13a and 13b are provided between the amplifiers 5 and 6, between the amplifier 8a and the deemphasis circuit 9a, and between the amplifier 8b and the deemphasis circuit 9b, respectively.

The mute circuits 12, 13a and 13b are controlled by an output signal Smu of a non-lock detector 20 to detect a non-lock or unstable state of a phase-locked loop frequency synthesizer as described later, interrupting signal transmission paths to mute audio outputs.

The output frequency fo of VCO 2b is divided by a factor of four, for example, by a prescaler 14, and the output frequency (fo/4) of the prescaler 14 is further divided by a factor of N by a programmable counter 15. The dividing factor N is set by a program input code signal from an auto scanner or a program board (not shown). The auto scanner is so adapted as to supply the programmable counter 15 with such a program input that may change the dividing factor N of the programmable counter 15 in integral steps automatically to scan channels, while the program board is so adapted as to provide the counter with such an input signal that may cause the frequency synthesizer to select a desired channel by an external manual selection. The programmable counter 15 is so constructed as to produce one output pulse each time it counts output pulses from the prescaler 14 by a number (N) determined by the program input signal, thereby dividing the output frequency (fo/4) of the prescaler 14 by N.

The output signal of the programmable counter 15 is applied to a phase comparator 16, where it is compared in phase with the output signal or reference frequency fref from a reference oscillator 17. The reference oscillator 7, which may be a crystal oscillator using a crystal oscillating element 18 resonating at 6.4 MHz, for example, is so arranged as to divide a 6.4-MHz signal by 256 to produce a reference frequency fref of 25 KHz. An output signal Sa of the phase comparator 16 is applied to a charge pump and lowpass filter 19 to produce a DC control signal Vc with a magnitude corresponding to the phase difference between the two input signals of the phase comparator 16. The control signal Vc is supplied to VCO 2b to control its oscillation frequency and also supplied to tuning elements in the radio frequency amplifier 2a and the mixer circuit 2c to control the tuning frequency. The VCO 2b, prescaler 14, programmable counter 15, phase comparator 16, and loop filter 19 constitute a phase-locked loop, which is stabilized in a state where the phase difference between the two input signals to the phase comparator 16 becomes zero, in other words, where the output frequency fo/4N of the programmable counter 15 equals the reference frequency fref. It is evident that the output frequency fo of VCO 2b equals 4N·fref when the phase-locked loop is in the stable state. When the dividing factor N is changed in integral steps, the output frequency of VCO 2b changes in 100-KHz steps if the reference frequency fref is 25 KHz. In the USA, however, the channel space is 200 KHz, so that the dividing factor of the prescaler 14 may be selected at 8, or the reference frequency may be set at 50 KHz.

Further, in FIG. 1, the output signal Sa of the phase comparator 16 is also applied to the non-lock detector 20. The non-lock detector 20 detects by the output signal Sa of the phase comparator 16 an unstable state of the phase locked loop, that is, a state in which the output signal of the programmable counter 15 does not coincide with the output signal of the reference oscillator 17 in phase. In the unstable state, the non-lock detector 20 produces the mute control signal Smu to operate the mute gate circuits 12, 13a and 13b. To the non-lock detector 20 is connected an indicator 21, such as a light-emitting diode or lamp, which lights when the phase-locked loop is in lock, thereby visually indicating a lock state of phase-locked loop.

Figure 2:
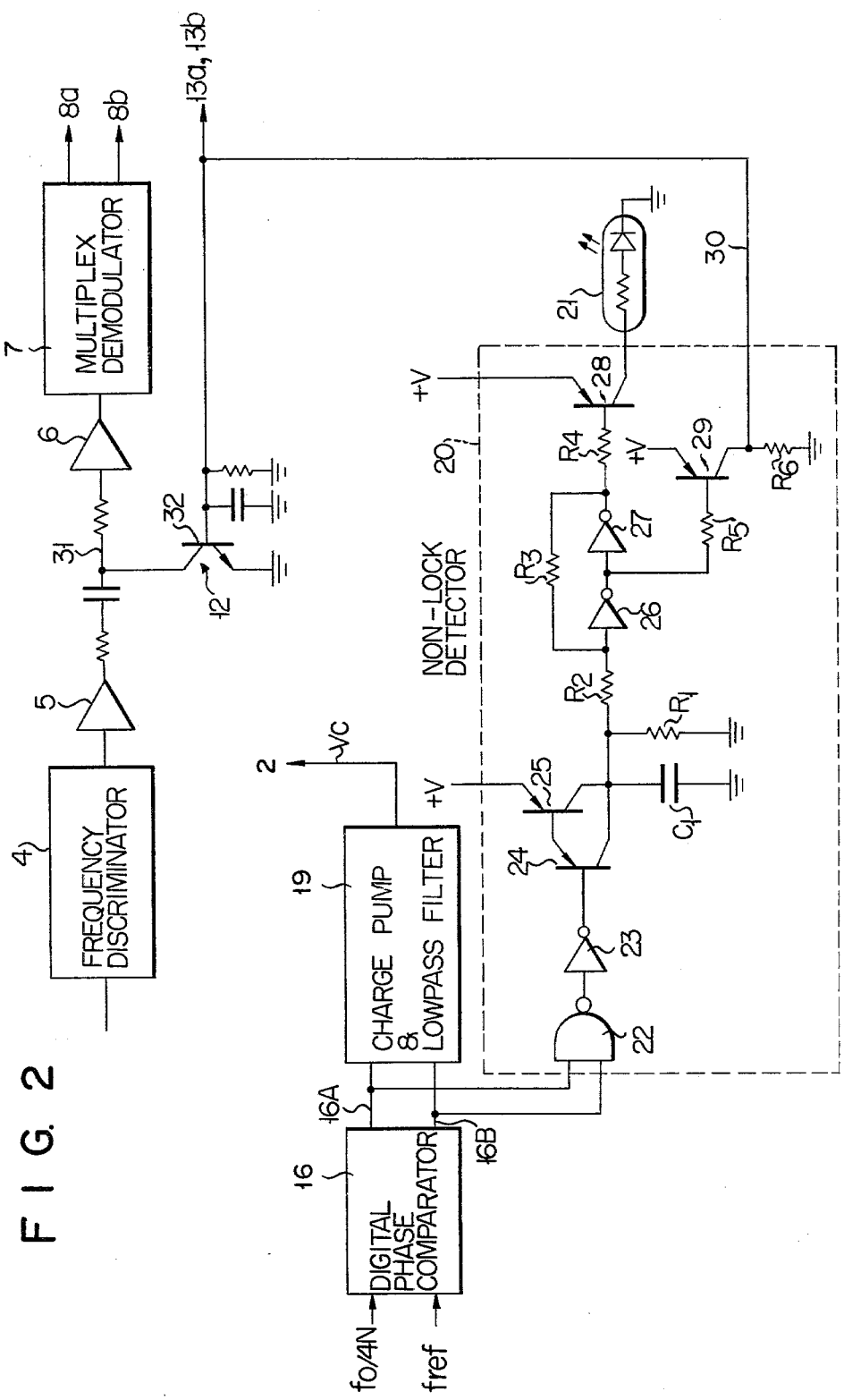
FIG. 2 shows an example of the practical arrangement of a mute circuit and non-lock detector as shown in FIG. 1.

Referring now to FIG. 2, there will be described an example of the non-lock state detection circuit 20 and the mute gate circuit 12. For the phase comparator 16 of FIG. 2, there is used a digital phase comparator such as readily available Motorola "MC 4344" phase-frequency detector. This phase comparator is arranged so that its outputs 16A and 16B go high when the two input signals are in phase, and that one of the outputs 16A and 16B remains high while a pulse waveform appears at the other output when the two input signals are out of phase. The mean value of the pulse waveform appearing at one of outputs of the phase comparator is proportional to the phase difference between the two input signals.

The outputs 16A and 16B of the phase comparator 16 are connected to a NAND gate 22, whose output is connected through an inverter 23 to the base of a transistor 24. The transistor 24 is combined with a transistor 25 to constitute a Darlington circuit. A parallel circuit of a capacitor C1 and a resistor R1 is connected between collectors of these transistors 24 and 25 and ground. The collector of transistor 25 is connected to the input of an inverter 26 through a resistor R2. The output of the inverter 26 is connected to the input of an inverter 27. A positive feedback is provided between the output of the inverter 27 and the input of the inverter 26 by means of a resistor R3. Thus, the inverters 26 and 27 and the feedback resistor R3 form a Schmitt circuit. The output of the inverter 27 is connected to the base of a transistor 28 through a resistor R4. The transistor 28, which is used for driving the indicator 21, has its emitter connected to a power source (+V) and its collector to ground through the indicator 21 comprised of a light-emitting diode, for example.

The output of the inverter 26 is connected to the base of a transistor 29 through a resistor R5. The transistor 29, which is intended for production of the mute control signal Smu, has its emitter connected to the power source (+V) and its collector to ground through a resistor R6. An output 30 of the non-lock detector 20 which is connected to the collector of transistor 29 is coupled to the base of a muting transistor 32 connected between a signal transmission path 31 extending from the frequency discriminator 4 to the multiplex demodulator 7 and ground. The output 30 of the non-lock detector 20 is also coupled to the other mute gate circuits 13a and 13b which may be formed like the mute gate circuit 12 comprised of the transistor 32.

When the output signal (fo/4N) of the programmable counter and the output signal (fref) of the reference oscillator are not coincident in phase, the NAND gate 22 is enabled by a high-level signal taken off from one output of the phase comparator 16. Accordingly, at the output of the inverter 23 appear a pulse output which is produced at the other output of the phase comparator 16. The output pulse of the inverter 23 is amplified by the transistors 24 and 25, and integrated by an integration circuit comprised of the capacitor C1 and resistor R1. Thus, the output voltage of the integration circuit increases gradually. When the output voltage of the integration circuit reaches the threshold voltage of the Schmitt circuit, the output voltage of the inverter 26 immediately turns to a low level, whereas the output voltage of the inverter 27 goes high at once. Accordingly, the transistor 29 conducts to develop the mute control signal Smu which will cause the muting transistor 32 to conduct. Since the output of the inverter 27 goes high, the transistor 28 is rendered nonconducting, and the light-emitting diode 21 is not lighted. Thus, when the phase-locked loop is out of lock, the signal transmission path is interrupted to mute the audio outputs, and the indicator 21 is not lighted.

Next, when the phase-locked loop is locked, both the outputs 16A and 16B of the phase comparator 16 go high. Therefore, the input voltage of the transistor 24 is high, so that the transistors 24 and 25 are made nonconducting. Consequently, the integration capacitor C1 discharges through the resistor R1. When the output voltage of the integration circuit is lowered to a predetermined level, the outputs of the and inverters 26 and 27 go high and low, respectively. As a result, the transistor 29 is rendered nonconducting to disable the muting transistor 32, whereas the transistor 28 is rendered conducting to cause light-emitting diode 21 to light. That is, when the phase-locked loop is locked, the mute gate circuits 12, 13a and 13b are rendered inoperative to allow signal transmission. Then, the light-emitting diode 21 is lighted, visually indicating that the phase-locked loop is stable.

In the embodiment of FIGS. 1 and 2, the mute gate circuits operate only when the phase-locked loop is out of lock. Actually, however, receivers are often so constructed that the mute gate circuits may operate also when the input level of an incoming broadcast signal is low. Accordingly, it is possible to use an existing muting system in combination with the muting arrangement of this invention. In this case, the output of an input level detection circuit for detecting the input level of an incoming broadcast signal may be coupled with the output of the non-lock detector of the invention through an OR gate.

Moreover, although in the above-mentioned embodiment the indicator is so constructed as to be lighted when the phase-locked loop is in the lock state, it may also be so constructed as to light when the loop is in the non-lock state. Since, in this invention, there is provided the device for indicating the state of the phase-locked loop, it can readily be ascertained whether or not interruption of audio outputs is based on the non-lock state of the phase-locked loop.

What we claim is:

1. A radio receiver comprising:
   a signal transmission path including a mixer circuit for converting a radio-frequency signal into an intermediate frequency signal, an intermediate frequency amplifier for amplifying said intermediate frequency signal, and a detection circuit for demodulating said intermediate frequency signal;
   a local oscillator circuit means having a phase-locked loop comprised of a voltage-controlled oscillator for providing a local-frequency signal to said mixer circuit, a frequency divider for dividing the output frequency of said voltage-controlled oscillator, a reference signal generator to produce a reference frequency signal, a phase comparator for comparing in phase said reference frequency signal with the output signal of said frequency divider, and a loop filter connected between said phase comparator and said voltage-controlled oscillator for supplying said voltage-controlled oscillator with a control voltage signal having a magnitude which is a function of the phase difference between the input signals of said phase comparator;
   a non-lock detection circuit means connected to the output of said phase comparator for detecting a non-lock state of said phase-locked loop in which the output signals of said frequency divider and said reference signal generator are not coincident in phase; and
   mute gate circuit means provided at the output side of said detection circuit of said signal transmission path of the receiver and responsive to said non-lock detection circuit means to mute the demodulated output signal at said signal transmission path, thereby interrupting production of an audio signal from the output of the receiver when the output signals of said frequency divider and signal reference signal generator are not coincident in phase.

2. An FM radio receiver comprising:
   a local oscillator circuit means having a phase-locked loop comprised of a voltage-controlled oscillator, a frequency divider for dividing the output frequency of said voltage-controlled oscillator, a reference signal generator to produce a reference frequency signal, a phase comparator for comparing in phase said reference frequency signal with the output signal of said frequency divider, and a loop filter connected between said phase comparator and said voltage-controlled oscillator for supplying said voltage-controlled oscillator with a voltage signal having a magnitude which is a function of the phase difference between the input signals of said phase comparator;
   a mixer circuit for mixing an incoming broadcast FM signal with the output signal of said voltage-controlled oscillator to produce an intermediate frequency FM signal;
   a frequency discriminator connected to receive the intermediate frequency FM signal from said mixer circuit;
   a non-lock detection circuit means connected to the output side of said phase comparator for detecting a non-lock state of said phase locked loop in which the output signals of said frequency divider and said reference signal generator are not coincident in phase; and
   mute gate circuit means provided at the output side of said frequency discriminator of a signal transmission path of the receiver and responsive to said non-lock detection circuit means to mute the output signal of said frequency discriminator, thereby interrupting production of an audio signal from the output of the receiver when the output signals of said frequency divider and said reference signal generator are not coincident in phase.

3. A radio receiver according to claim 1 or 2 further including indicator means connected to said non-lock detection circuit means for visually indicating a lock state of said phase-locked loop.

4. An FM radio receiver according to claim 2, wherein said phase comparator is a digital phase comparator.

5. An FM radio receiver according to claim 2 further including a stereo detector connected to the output of said frequency discriminator and having left and right audio outputs, and left and right audio mute gate circuit means connected to the left and right audio outputs of said stereo detector which are controlled by said non-lock detection circuit means.

* * * * *